United States Patent
Chen et al.

(10) Patent No.: US 11,552,209 B2
(45) Date of Patent: Jan. 10, 2023

(54) COVER PLATE AND PHOTOVOLTAIC MODULE

(71) Applicant: Dong Chen, Shanghai (CN)

(72) Inventors: Dong Chen, Shanghai (CN); Xiaoxuan Chen, Shanghai (CN)

(73) Assignee: Dong Chen, Shanghai (CN)

( * ) Notice: Subject to any disclaimer, the term of this patent is extended or adjusted under 35 U.S.C. 154(b) by 145 days.

(21) Appl. No.: 17/086,176

(22) Filed: Oct. 30, 2020

(65) Prior Publication Data

US 2022/0131022 A1 Apr. 28, 2022

(30) Foreign Application Priority Data

Oct. 28, 2020 (CN) .......................... 202011174466.5

(51) Int. Cl.
*H01L 31/048* (2014.01)
*H01L 31/0216* (2014.01)

(52) U.S. Cl.
CPC ...... *H01L 31/048* (2013.01); *H01L 31/02168* (2013.01)

(58) Field of Classification Search
None
See application file for complete search history.

(56) References Cited

U.S. PATENT DOCUMENTS

2015/0221792 A1   8/2015   Deshpande et al.

FOREIGN PATENT DOCUMENTS

| CN | 201023407 Y | 2/2008 |
|---|---|---|
| CN | 101591946 | 12/2009 |
| CN | 102637760 B | 8/2012 |
| CN | 202746914 U | 2/2013 |
| CN | 103028700 A | 4/2013 |
| CN | 203218294 U | 9/2013 |
| CN | 103413854 A | 11/2013 |
| CN | 103545391 A | 1/2014 |
| CN | 104821342 A | 8/2015 |
| CN | 206546824 U | 10/2017 |
| CN | 210335129 U | 4/2020 |

OTHER PUBLICATIONS

English Machine Translation CN 2065468246, accessed May 19, 2022.*
English Machine Translation CN 210335129, accessed May 19, 2022.*
English Machine Translation CN 104821342, accessed May 19, 2022.*
Non final Office Action received in Chinese Application No. 202011174466.5, dated Nov. 25, 2021 in 19 pages.
Notice of Allowance for Chinese Application No. CN 202011174466.5 (5 pages).

* cited by examiner

*Primary Examiner* — Shannon M Gardner
(74) *Attorney, Agent, or Firm* — Knobbe, Martens, Olson & Bear, LLP (57) ABSTRACT

Provided is a cover plate and a photovoltaic module. The cover plate is configured to form a photovoltaic module together with a solar cell string, and the cover plate includes: at least one through hole provided in the cover plate and penetrating through the cover plate, a reinforced region surrounding the at least one through hole, and a flat region adjacent to the reinforced region; wherein a thickness of the cover plate in the reinforced region is greater than a thickness of the cover plate in the flat region. The cover plate and the photovoltaic module according to the embodiments of the present disclosure may solve the problem of poor load resistance capability of the cover plate.

18 Claims, 5 Drawing Sheets

COVER PLATE AND PHOTOVOLTAIC MODULE

CROSS-REFERENCE TO RELATED DISCLOSURES

The present application claims priority to Chinese Patent Application No. 202011174466.5, filed on Oct. 28, 2020, the content of which is incorporated herein by reference in its entirety.

TECHNICAL FIELD

The present disclosure relates to the field of photovoltaic modules and, in particular, to a cover plate and a photovoltaic module.

BACKGROUND

Solar energy, as green renewable energy, has attracted increasingly more attention with the highlighting of issues such as energy shortage, global temperature rising, and environment degradation. A photovoltaic module is a device for converting renewable solar energy into electric energy. For a photovoltaic module, a through hole generally needs to be provided in a cover plate of the photovoltaic module, through which a junction box is mounted to lead out electrodes and is connected to a load to form a circuit. However, cover plates in current photovoltaic modules have poor load resistance capability.

SUMMARY

The technical problem solved by the embodiments of the present disclosure is to provide a cover plate and a photovoltaic module to solve the problem that cover plates has poor load resistance capability.

To solve the above problem, the embodiments of the present disclosure provide a cover plate for a photovoltaic module, the cover plate including: at least one through hole penetrating through the cover plate, a reinforced region surrounding the at least one through hole, and a flat region adjacent to the reinforced region, wherein a thickness of the cover plate in the reinforced region is greater than a thickness of the cover plate in the flat region.

In an embodiment, the thickness of the cover plate in the reinforced region gradually decreases along a direction from the reinforced region toward the flat region.

In an embodiment, a surface of the cover plate in the reinforced region is a smooth transition inclined surface or a smooth transition curved surface.

In an embodiment, a surface of the cover plate in the reinforced region and a surface of the cover plate in the flat region are connected by a connecting line parallel to the surface of the cover plate in the flat region.

In an embodiment, the cover plate has a front face and a back face opposite to the front face, wherein the front face in the reinforced region bulges away from the back face relative to the front face in the flat region, and the back face in the reinforced region bulges away from the front face relative to the back face in the flat region.

In an embodiment, a difference between a maximum thickness of the cover plate in the reinforced region and the thickness of the cover plate in the flat region is in a range from 0.1 mm to 0.5 mm.

In an embodiment, the cover plate is a glass cover plate, a polymer cover plate, or a stainless steel cover plate.

In an embodiment, in a sectional plane parallel to a surface of the cover plate in the flat region, a section of the through hole has a circular shape or an elliptic shape.

In an embodiment, a width R of the through hole, a width w of the reinforced region, the thickness d of the cover plate in the flat region, and a difference L between a maximum thickness of the cover plate in the reinforced region and the thickness of the cover plate in the flat region satisfy following relation:

$$w \geq \frac{8 \times L \times \sqrt{R}}{d}.$$

In an embodiment, the cover plate the cover plate comprises a central region and a peripheral region located on two opposite sides of the central region, respectively, and the at least one through hole comprises: a first through hole located in the central region and a second through hole located in the peripheral region, a mechanical strength of the reinforced region corresponding to the second through hole is greater than a mechanical strength of the reinforced region corresponding to the first through hole.

In an embodiment, a maximum thickness of the cover plate in the reinforced region corresponding to the first through hole is a first thickness, a maximum thickness of the cover plate in the reinforced region corresponding to the second through hole is a second thickness, and the first thickness is less than the second thickness.

In an embodiment, in a sectional direction parallel to a surface of the cover plate in the flat region, a sectional area of the first through hole is greater than a sectional area of the second through hole.

In an embodiment, the surface of the cover plate in the flat region is a first surface, the cover plate further comprises a second surface facing toward a solar cell string of the photovoltaic module and a third surface opposite to the second surface, and in a sectional direction perpendicular to the first surface, a second sectional area of the second through hole gradually increases in a direction from the second surface toward the third surface.

In an embodiment, in the sectional direction perpendicular to the first surface, a sidewall surface of the second through hole is inclined relative to the first surface.

In an embodiment, in the sectional direction perpendicular to the first surface, a sidewall surface of the second through hole is a stepped surface.

In an embodiment, in the sectional direction perpendicular to the first surface, a sidewall surface of the first through hole is perpendicular to the first surface.

Embodiments of the present disclosure further provide a photovoltaic module, including the cover plate described above and at least one solar cell string.

In an embodiment, the photovoltaic module further includes at least one lead wire electrically connected, through the at least one through hole, to at least one solar cell in the at least one solar cell string.

In an embodiment, the cover plate is a back panel of the photovoltaic module, and the photovoltaic module further comprises a front panel located on a side of the at least one solar cell string facing away from the cover plate.

In an embodiment, the photovoltaic module further includes an anti-reflection film disposed on a surface of the cover plate, and a thickness of the anti-reflection film in the reinforced region is greater than a thickness of the anti-reflection film in the flat region.

Compared with the existing technology, the technical solutions provided in the embodiments of the present disclosure has the following advantages:

The embodiments of the present disclosure provide a cover plate with superior structural performance. The cover plate for a photovoltaic module includes at least one through hole penetrating through the cover plate, a reinforced region surrounding the at least one through hole, and a flat region adjacent to the reinforced region. A thickness of the cover plate in the reinforced region is greater than a thickness of the cover plate in the flat region. In this way, the thickness of the cover plate in the reinforced region surrounding the through hole is enhanced, thereby improving the strength of the cover plate in the reinforced region surrounding the through hole, which is conducive to avoiding the problems such as sub-fissures and cracking of the cover plate under stress, improving the load resistance capability of the cover plate, and thus enhancing the load resistance capability of the photovoltaic module and improving the reliability of the photovoltaic module.

In addition, a surface of the cover plate in the reinforced region is a smooth transition inclined surface or a smooth transition curved surface, and the thickness of the cover plate in the reinforced region gradually decreases along a direction from the reinforced region toward the flat region. In this way, the surface of the reinforced region is a smooth transition surface, it is thus conducive to avoiding the problem of pressure concentration, thereby avoiding the problem of fracture of the cover plate caused by the pressure concentration and thus facilitating to further improve the load resistance capability of the cover plate.

In addition, a difference between a maximum thickness of the cover plate in the reinforced region and the thickness of the cover plate in the flat region is in a range from 0.1 mm to 0.5 mm. The difference between the maximum thickness of the cover plate in the reinforced region and the thickness of the cover plate in the flat region being no less than 0.1 mm improves the strength of the cover plate in a periphery region of the through hole, thereby improving the load resistance capability of the cover plate. The difference between the maximum thickness of the cover plate in the reinforced region and the thickness of the cover plate in the flat region being no more than 0.5 mm makes a stress difference between the flat region and the reinforced region small, which avoids the problem of excessive pressure concentration, thereby further avoiding the problem of fracture of the cover plate caused by the pressure concentration and further improving the load resistance capability of the cover plate.

BRIEF DESCRIPTION OF DRAWINGS

The embodiments are illustrated according to the accompanying drawings, the illustrations do not limit the embodiments. Unless specifically stated, the figures in the accompanying drawings do not constitute limitations in scale.

DESCRIPTION OF EMBODIMENTS

From the background technology, it is clear that the performance of the photovoltaic module in the existing technology needs to be improved.

During manufacturing of a photovoltaic module, a through hole generally needs to be provided in a cover plate of the photovoltaic module, through which a junction box is mounted to lead out electrodes and connected to a load to form a circuit. The configuration of the through hole may weaken the strength of the periphery of the through hole of the cover plate. In a lamination process, the cover plate is stressed, and the periphery of the through hole is prone to occur sub-fissure or cracking, thereby leading to poor reliability or yield of the photovoltaic module. In addition, during use of the photovoltaic module, the strength of the periphery of the through hole of the cover plate may weaken, and when the photovoltaic module is stressed during use, the periphery of the through hole of the cover plate is also prone to occur sub-fissure or cracking, thereby leading to reduction of the reliability of the photovoltaic module. In other words, the current problem of low load resistance capability of the cover plate leads to low load resistance capability of the photovoltaic module, which may adversely affect the reliability of the photovoltaic module.

To solve the above problems, the embodiments of the present disclosure provide a cover plate and a photovoltaic module, which may increase the thickness of the cover plate in a periphery region of a through hole of the cover plate and improve load resistance capability of the cover plate. To better illustrate the objectives, technical solutions, and advantages of the embodiments of the present disclosure, the embodiments of the present disclosure are elaborated in detail below with reference to the accompanying drawings. However, those of ordinary skill in the art may understand that lots of technical details are presented in the embodiments of the present disclosure to enable the reader to better understand the present disclosure. However, even in the absence of the technical details and variations and modifications based on the following embodiments, the technical solution for which protection is sought by the present disclosure may also be implemented.

Figure 1:
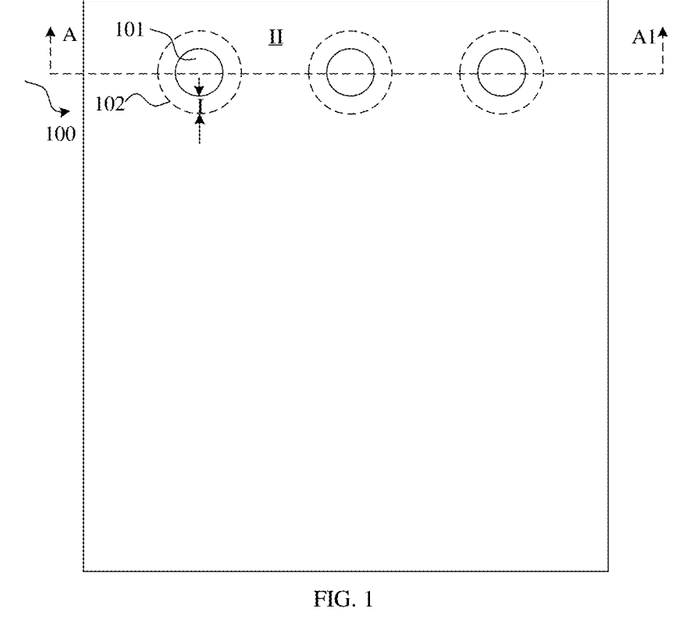
FIG. 1 is a schematic structural top view of a cover plate according to an embodiment of the present disclosure.
Figure 2:
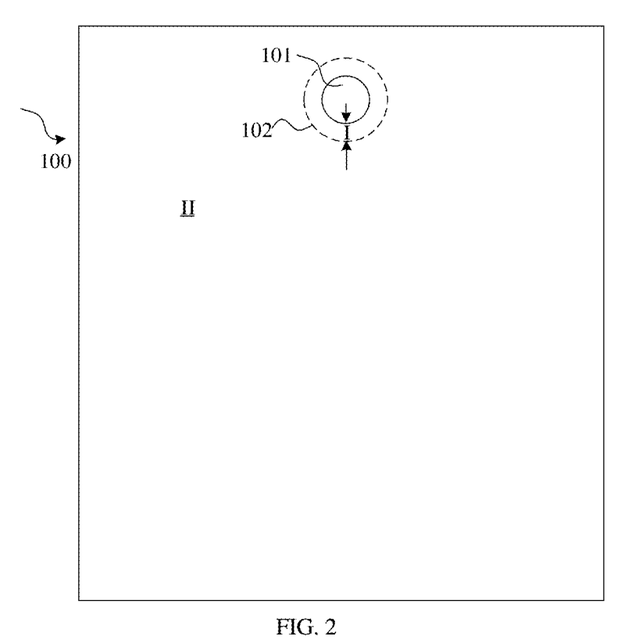
FIG. 2 is a schematic structural top view of a cover plate according to another embodiment of the present disclosure.
Figure 3:
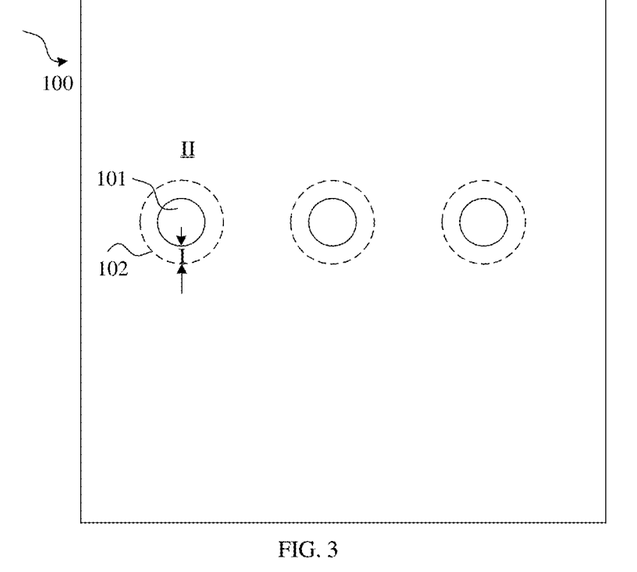
FIG. 3 is a schematic structural top view of a cover plate according to still another embodiment of the present disclosure.
Figure 4:
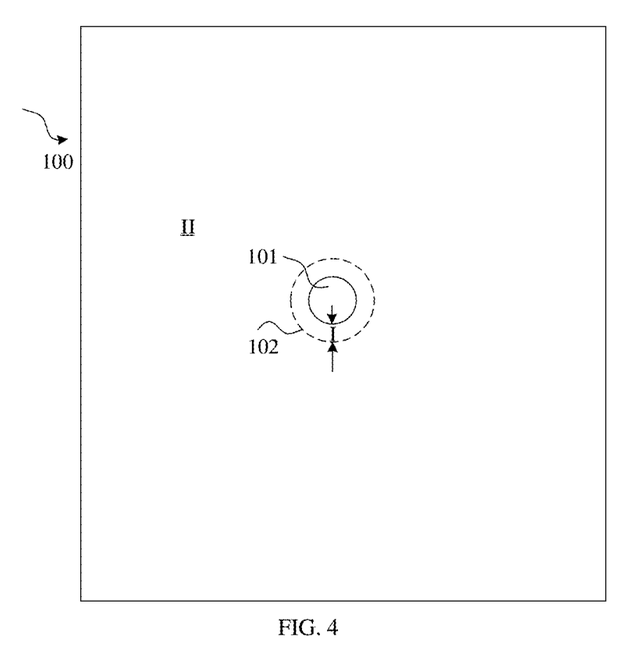
FIG. 4 is a schematic structural top view of a cover plate according to yet still another embodiment of the present disclosure
Figure 5:
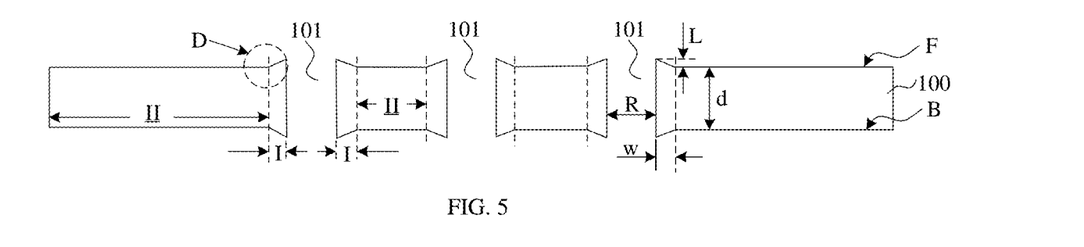
FIG. 5 is a schematic sectional diagram along AA1 direction in FIG. 1.
Figure 6:
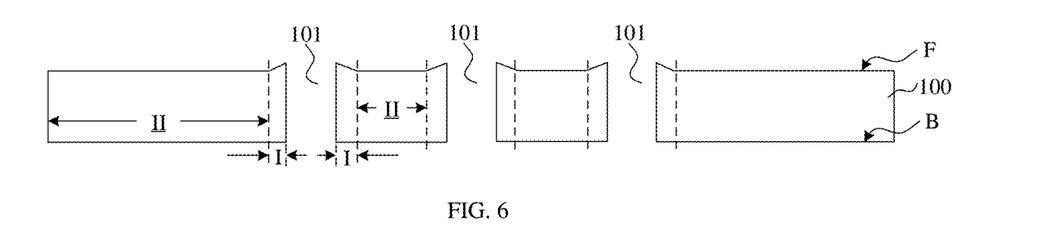
FIG. 6 is another schematic sectional diagram along AA1 direction in FIG. 1.
Figure 7:
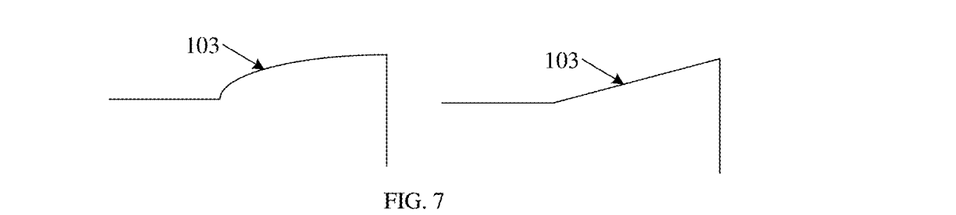
FIG. 7 is two enlarged schematic structural diagrams of region D in FIG. 5.

FIG. 1 is a schematic structural top view of a cover plate according to an embodiment of the present disclosure; FIG. 2 is a schematic structural top view of a cover plate according to another embodiment of the present disclosure; FIG. 3 is a schematic structural top view of a cover plate according to still another embodiment of the present disclosure; FIG. 4 is a schematic structural top view of a cover plate according to yet still another embodiment of the present disclosure; FIG. 5 is a schematic sectional diagram along AA1 direction in FIG. 1; FIG. 6 is another schematic sectional diagram along AA1 direction in FIG. 1; and FIG. 7 is two enlarged schematic structural diagrams of region D in FIG. 5.

Referring to FIG. 1 to FIG. 7, in an embodiment, a cover plate 100 is configured to form a photovoltaic module together with a solar cell string. The cover plate 100 has at least one through hole 101 penetrating through the cover plate 100, and the cover plate 100 includes a reinforced region I around the through hole 101 and a flat region II adjacent to the reinforced region I. The thickness of the cover plate 100 in the reinforced region I is greater than the thickness of the cover plate 100 in the flat region II.

The cover plate provided will be described in detail below with reference to the accompanying drawings.

The cover plate 100 may be a glass cover plate, a polymer cover plate, or a stainless steel cover plate. In particular, in an embodiment, the cover plate 100 is a front panel of the photovoltaic module, that is, the cover plate 100 is located on a side of the solar cell string facing the sunlight. Correspondingly, the cover plate 100 is configured as a glass cover plate. In another embodiment, the cover plate 100 is a back panel of the photovoltaic module. That is, the cover plate 100 is located on a side of the solar cell string facing away from the sunlight. Correspondingly, when the photovoltaic module is a double-glazed module, the cover plate 100 is a glass cover plate, and when the photovoltaic module is a single-glazed module, the cover plate 100 may be a polymer cover plate or a stainless steel cover plate. It can be understood that, in other embodiments, the cover plate may constitute both a front panel and a back panel of the photovoltaic module.

The cover plate 100 includes a front face F and a back face B. The front face F refers to a surface facing the solar cell string, and the back face B refers to a surface facing away from the solar cell string.

The function of the through hole 101 may include: when the cover plate 100 is configured to form a part of a photovoltaic module, a lead wire electrically connected to a solar cell in the photovoltaic module may pass through the through hole 101, so that the solar cell is electrically connected to a lead wire of a junction box.

In this embodiment, as shown in FIG. 1, the through hole 101 is located at an edge position of the cover plate 100, and the cover plate 100 has three through holes 101 to match a split-type junction box. In another example, as shown in FIG. 2, the cover plate 100 may also have a through hole 101 to match an integral junction box. It can be understood that the number of the through hole 101 may be reasonably configured according to the number of solar cells to be connected.

In addition, in another example, as shown in FIG. 3 and FIG. 4, the through hole 101 may be further located in a central position of the cover plate 100, and the number of the through hole 101 may be any number such as 1, 2, 3, 4, 5, or 6. It can be understood that in other embodiments, the through hole may be reasonably provided in a corresponding region of the cover plate according to the position of the solar cell to be connected.

On a sectional surface parallel to a surface of the cover plate 100 in the flat region II, a section of the through hole 101 may have a circular or elliptic shape, alternatively, the section of the through hole 101 may also have a square shape. In particular, in a sectional direction parallel to the front face F of the cover plate 100, the section of the through hole 101 may have a circular, elliptic or square shape. The section of the through hole 101 may have a regular or irregular shape. In an embodiment, the section of the through hole 101 may have a regular shape. Correspondingly, a central axis of the through hole 101 coincides with a central axis of the reinforced region I, which is conducive to further ensuring that the periphery region of the through hole 101 has higher strength compared with the flat region II, thereby further improving the load resistance capability of the cover plate 100.

In this embodiment, along a direction of the reinforced region I toward the flat region II, a distance between the reinforced region I and a sidewall of the through hole 101 (i.e. the width of the reinforced region I) is in a range from 2 mm to 15 mm. For example, the distance may be 4 mm, 6 mm, 10 mm, or the like. The distance between the reinforced region I and the sidewall of the through hole 101 being greater than 2 mm may ensure that sufficient periphery region of the through hole 101 have high strength, thereby further preventing the formation of sub-fissure in the periphery region of the through hole 101. In addition, the distance between the reinforced region I and the sidewall of the through hole 101 being less than 15 mm makes a regional extent of the reinforced region I relatively small, thereby saving production costs of the cover plate 100.

A surface of the cover plate 100 in the reinforced region I and a surface of the cover plate 100 in the flat region II are connected by a connecting line 102 that is parallel to the surface of the cover plate 100 in the flat region II. The connecting line 102 is parallel to the surface of the cover plate 100 may be understood as: at a junction of the reinforced region I and the flat region II, the thickness of the cover plate 100 in the flat region II is the same as that of the cover plate 100 in the reinforced region I. The connecting line 102 is parallel to the front face F of the cover plate 100, which is conducive to improving the flatness of the cover plate 100, so that the cover plate 100 as an entirety has better load resistance capability.

In an example, the connecting line 102 may be a closed ring, that is, the whole periphery region of the through hole 101 is thickened, and the reinforced region I defines a closed ring around the through hole 101. In another example, the connecting line 102 may also be an unclosed ring, that is, a part of the periphery region of the through hole 101 is not thickened, and the reinforced region I defines an unclosed ring around the through hole 101.

The thickness of the cover plate 100 in the reinforced region I gradually decreases along a direction from the reinforced region I toward the flat region II. In addition, referring to FIG. 7, a surface of the cover plate 100 in the reinforced region I is a smooth transition inclined surface 103 or a smooth transition curved surface 103. Since the surface of the reinforced region I is a smooth transition surface, it is conducive to avoid the problem of pressure concentration, thereby avoiding the problem of fracture of the cover plate 100 caused by the pressure concentration and then facilitating to further improve the load resistance capability of the cover plate 100.

Upon analysis, it is found that if a thickness d of the cover plate 100 in the flat region II is thicker, the cover plate 100 around the through hole 101 is less likely to fracture, and a width w of the corresponding reinforced region I may be set to be smaller, that is, the width w of the reinforced region I is inversely proportional to the thickness d of the cover plate 100 in the flat region II; if a width R of the through hole 101 is smaller, the cover plate 100 around the through hole 101 is less likely to fracture, and the width w of the corresponding reinforced region I may be set to be smaller, that is, the width R of the through hole 101 is directly proportional to the width w of the reinforced region I; and if a thickness difference L between a maximum thickness of the cover plate 100 in the reinforced region I and the thickness of the cover plate 100 in the flat region II is greater, in order to avoid the problem of stress concentration, the width dimension w of the corresponding reinforced region I is also set to be greater, that is, the width w of the reinforced region I is directly proportional to the thickness difference L.

Upon further analysis, it is found that the width R of the through hole 101, the width w of the reinforced region I, the thickness d of the cover plate 100 in the flat region II, and the difference L between the maximum thickness of the cover plate 100 in the reinforced region I and the thickness of the cover plate 100 in the flat region II meet the following formula:

$$w \geq \frac{8 \times L \times \sqrt{R}}{d}$$

where w is the width of the reinforced region I, d is the thickness of the cover plate 100 in the flat region II, L is the difference between the maximum thickness of the cover plate 100 in the reinforced region I and the thickness of the cover plate 100 in the flat region II, and R is the width of the through hole 101.

It should be noted that in the above formula, L is in unit of mm, R is in unit of mm, d is in unit of mm, and w is in unit of mm.

In an embodiment, the difference L between the maximum thickness of the cover plate 100 in the reinforced region I and the thickness of the cover plate 100 in the flat region II is in a range from 0.1 mm to 0.5 mm, which may be 0.2 mm, 0.4 mm, or the like. The difference L between the maximum thickness of the cover plate 100 in the reinforced region I and the thickness of the cover plate 100 in the flat region II being no less than 0.1 mm improves the strength of the cover plate 100 in a periphery region of the through hole 101, thereby improving the load resistance capability of the cover plate 100. The difference L between the maximum thickness of the cover plate 100 in the reinforced region I and the thickness of the cover plate 100 in the flat region II being no more than 0.5 mm makes a stress difference between the flat region II and the reinforced region I small, which avoids the problem of excessive pressure concentration and avoids the problem of fracture of the cover plate 100 caused by the pressure concentration, thereby improving the load resistance capability of the cover plate 100.

As an example, the thickness of the cover plate 100 in the flat region II is 1.6 mm, and the maximum thickness of the cover plate 100 in the reinforced region I is in a range from 1.7 mm to 2.1 mm. As another example, the thickness of the cover plate 100 in the flat region II is 1.8 mm, and the maximum thickness of the cover plate 100 in the reinforced region I is in a range from 1.9 mm to 2.3 mm. As still another example, the thickness of the cover plate 100 in the flat region II is 2.0 mm, and the maximum thickness of the cover plate 100 in the reinforced region I is in a range from 2.1 mm to 2.5 mm. As yet another example, the thickness of the cover plate 100 in the flat region II is 2.5 mm, and the maximum thickness of the cover plate 100 in the reinforced region I is in a range from 2.6 mm to 3.0 mm.

In an embodiment, referring to FIG. 5, the front face F of the reinforced region I bulges away from the back face B relative to the front face F of the flat region II, and the back face B of the reinforced region I bulges away from the front face F relative to the back face B of the flat region II. Since the front face F and the back face B of the reinforced region I both bulge relative to the flat region II, it is conducive to reducing a height difference between the front face F and the back face B while improving the strength of the periphery region of the through hole 101.

As another example, referring to FIG. 6, the front face F of the reinforced region I bulges away from the back face B relative to the front face F of the flat region II, and the back face B of the reinforced region I may be flush with the back face B of the flat region II. In this way, it is also conductive to reducing the overall thickness of the photovoltaic module while improving the load resistance capability of the cover plate 100. For example, the cover plate 100 may be a back panel of the photovoltaic module. In a lamination process of manufacturing the photovoltaic module, during applying laminating pressure to the back face B of the cover plate 100, since the back face B of the cover plate 100 is a flat surface, it is conducive to further avoiding stress concentration on the back face B of the cover plate 100, thereby further avoiding the problem of sub-fissures or cracking of the cover plate 100.

According to the present disclosure, a cover plate 100 with superior structural performance is provided. The cover plate 100 for forming a photovoltaic module has at least one through hole 101, a reinforced region I around the through hole 101, and a flat region II adjacent to the reinforced region I. The thickness of the cover plate 100 in the reinforced region I is greater than the thickness of the cover plate 100 in the flat region I. In this way, the thickness of the cover plate 100 in the reinforced region I around the through hole 101 is enhanced, thereby improving the strength of the cover plate 100 in the reinforced region I around the through hole 101, which is conducive to avoiding the problems such as sub-fissures and cracking of the cover plate 100 under stress, and thus enhancing the load resistance capability of the photovoltaic module, and improving the reliability of the photovoltaic module.

Another embodiment of the present disclosure further provides a cover plate. The cover plate is substantially the same as the cover plate according to the above embodiments. Main differences are as follows: in the present embodiment, the cover plate includes a central region and a peripheral region located on two opposite sides of the central region, respectively; and the through hole includes: a first through hole located in the central region, and a second through hole located in the peripheral region, and a mechanical strength of the reinforced region corresponding to the second through hole is greater than that of the reinforced region corresponding to the first through hole. The cover plate provided in the present embodiment of the present disclosure is described in detail below with reference to the accompanying drawings.

Figure 8:
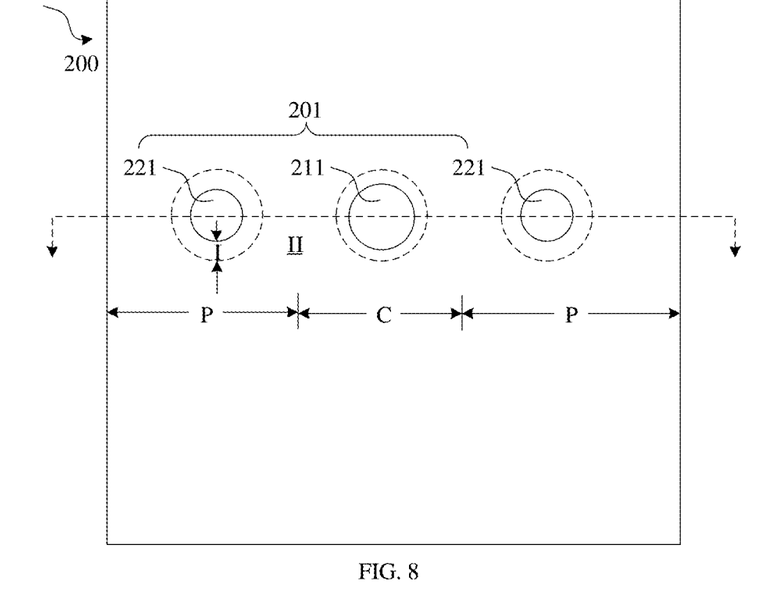
FIG. 8 is a schematic structural top view of a cover plate according to yet still another embodiment of the present disclosure.
Figure 9:
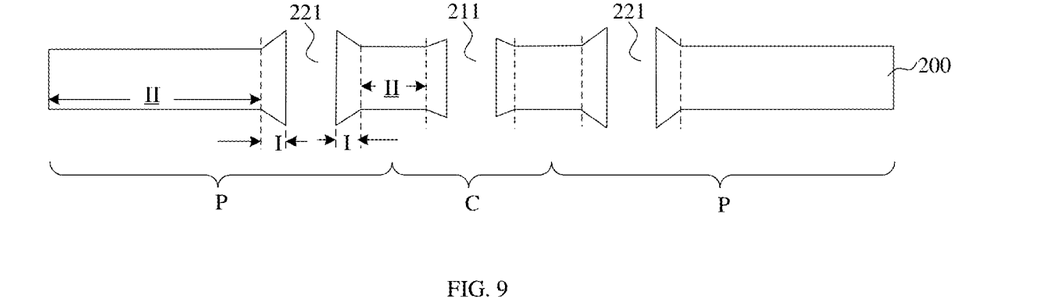
FIG. 9 is a schematic sectional diagram along AA1 direction in FIG. 8.
Figure 10:
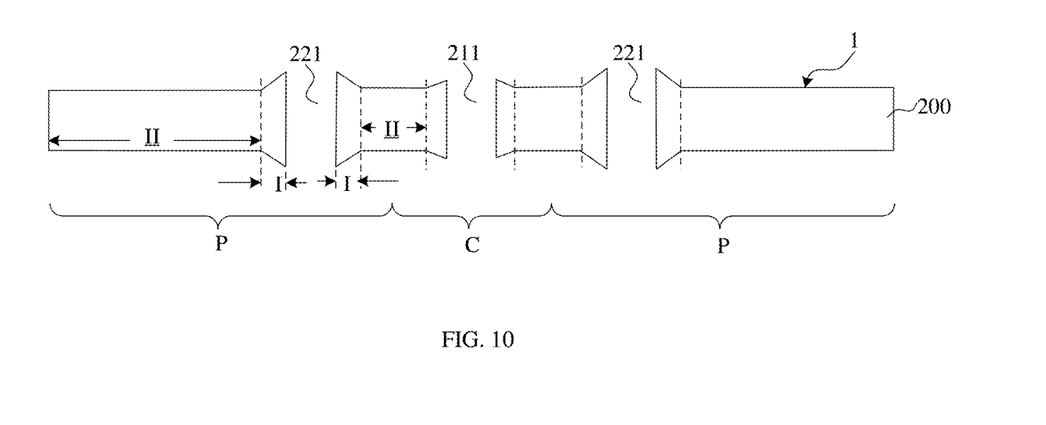
FIG. 10 is another schematic sectional diagram along AA1 direction in FIG. 8.
Figure 11:
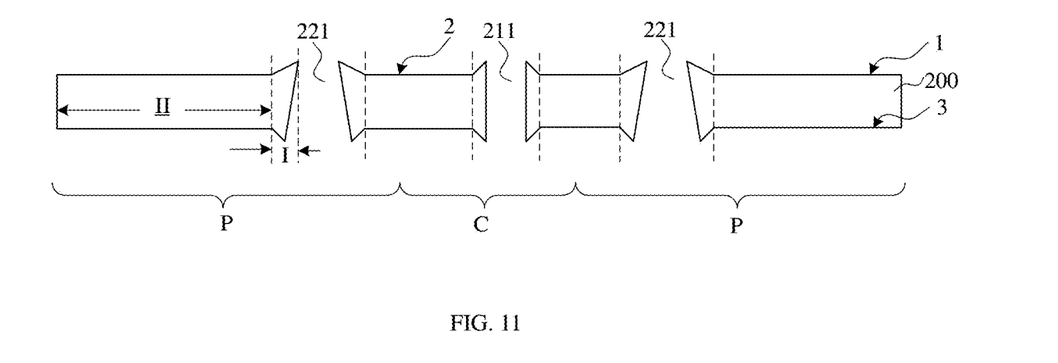
FIG. 11 is still another schematic sectional diagram along AA1 direction in FIG. 8.

FIG. 8 is a schematic structural top view of a cover plate according to yet still another embodiment of the present disclosure, and FIG. 9 to FIG. 11 are three different schematic sectional diagrams along AA1 direction in FIG. 8.

Referring to FIG. 8 to FIG. 11, in an embodiment, the cover plate 200 is configured to form a photovoltaic module together with a solar cell string. The cover plate 200 has a through hole 201 penetrating through the cover plate 200, the cover plate 200 includes a reinforced region I around the through hole 201, and a flat region II adjacent to the reinforced region I, and a thickness of the cover plate 200 in the reinforced region I is greater than a thickness of the cover plate 200 in the flat region II. In addition, the cover plate 200 further includes a central region C and a peripheral region P located on two opposite sides of the central region C, respectively; and the through hole 201 includes: a first through hole 211 located in the central region C; and a second through hole 221 located in the peripheral region P, and a mechanical strength of the reinforced region I corresponding to the second through hole 221 is greater than that of the reinforced region I corresponding to the first through hole 211.

As part of the photovoltaic module, the cover plate 200 may go through a lamination process required to manufacture the photovoltaic module. In the lamination process, the pressure applied to the peripheral region P is generally greater than that applied to the central region C. Therefore, the portion of the cover plate 200 around the second through hole 221 in the peripheral region P has a greater risk of cracking compared to the portion of the cover plate 200 around the first through hole 211 in the central region C. In addition, similarly, during use of the photovoltaic module, the portion of the cover plate 200 around the second through hole 221 in the peripheral region P has a greater risk of cracking compared to the portion of the cover plate 200 around the first through hole 211 in the central region C either.

In consideration of the above situation, in an embodiment, special structural design is proposed for the central region C and the peripheral region P, so that the mechanical strength of the reinforced region I in the peripheral region is greater than that of the reinforced region I in the central region C.

The cover plate provided in the present embodiment is described in detail below with reference to the accompanying drawings.

In an example, as shown in FIG. 9, a maximum thickness of the cover plate 200 in the reinforced region I corresponding to the first through hole 211 is a first thickness D1, a maximum thickness of the cover plate 200 in the reinforced region I corresponding to the second through hole 221 is a second thickness D2, and the first thickness D1 is less than the second thickness D2. As such, the maximum thickness D2 of the cover plate 200 in the reinforced region I of the peripheral region P is configured as greater than the maximum thickness D1 of the cover plate 200 in the reinforced region I of the central region C, so that an object of the mechanical strength of the reinforced region I in the peripheral region P being greater than that of the reinforced region I in the central region C may be achieved.

For example, a width W1 of the reinforced region I corresponding to the first through hole 211 may be less than a width W2 of the reinforced region I corresponding to the second through hole 221. A greater maximum thickness of the cover plate 200 in the reinforced region I corresponding to the through hole 201 indicates a greater width of the reinforced region I corresponding thereto. With such configuration, the stress concentration problem of the peripheral region P may be further alleviated while the mechanical strength of the reinforced region I in the peripheral region P is strengthened. It may be understood that in other examples, the width of the reinforced region corresponding to the first through hole may also be equal to that of the reinforced region corresponding to the second through hole.

In addition, as shown in FIG. 9, in a sectional direction parallel to a surface of the cover plate 200 in the flat region II, a sectional area of the first through hole 211 may be equal to that of the second through hole 221, and a sectional contour of the first through hole 211 is the same as that of the second through hole 221. With such configuration, the technical difficulty of processing the first through hole 211 and the second through hole 221 may be reduced. Moreover, from the overall appearance of the photovoltaic module, there is no difference between contour of the first through hole 211 and the second through hole 221, which is conducive to improving the aesthetics of the photovoltaic module.

The surface of the cover plate 200 in the flat region II is defined as a first surface 1. In the sectional direction perpendicular to the first surface 1, a sidewall surface of the first through hole 211 is perpendicular to the first surface 1, and a sidewall surface of the second through hole 221 is perpendicular to the first surface 1.

In addition, as shown in FIG. 9, the width of the reinforced region I in the peripheral region P is further greater than that of the reinforced region I in the central region C, which is conducive to further improving the mechanical strength of the reinforced region in the peripheral region. In other examples, the width of the reinforced region in the peripheral region may also be equal to that of the reinforced region in the central region.

In another example, as shown in FIG. 10, in a sectional direction parallel to a surface of the cover plate 200 in the flat region II, a sectional area of the first through hole 211 is greater than that of the second through hole 221. That is to say, the size of the second through hole 221 in the peripheral region P is relatively small, which is conducive to reducing an adverse effect of the configuration of the second through hole 221 on the mechanical strength of the cover plate 200 in the periphery region P.

For example, in a sectional direction perpendicular to the first surface 1, a sidewall surface of the first through hole 211 may be perpendicular to the first surface 1, and a sidewall surface of the second through hole 221 may be perpendicular to the first surface 1.

In another example, as shown in FIG. 11, a surface of the cover plate 200 in the flat region II is a first surface 1. The cover plate 200 has a second surface 2 facing toward the solar cell string and a surface 3 opposite to the second surface 2. It may be understood that in FIG. 11, the first surface 1 and the second surface 2 being two surfaces on the same side is taken as an example, and in other embodiments, the first surface and the third surface may also be two surfaces on the same side.

In in a sectional direction parallel to a surface of the cover plate 200 in the flat region II, a sectional area of the first through hole 211 is greater than that of the second through hole 221; and the second through hole 221 has a second sectional area in a sectional direction perpendicular to the first surface 1, and in a direction from the second surface 2 toward the third surface 3, the second sectional area gradually increases. That is to say, for the photovoltaic module, a farther distance to the solar cell string indicates a greater sectional area of the second through hole 221, which is conducive to further preventing the cover plate 200 in the reinforced region I from occurring sub-fissures and cracking. If the sectional area of the second through hole is greater in case of a closer distance to the solar cell string, for the cover plate in the reinforced region, a region of the cover plate in the reinforced region adjacent to the second through hole and close to the third surface is not supported, so the cover plate in the reinforced region close to the third surface is prone to sub-fissures and cracking.

For example, as shown in FIG. 11, in the sectional direction perpendicular to the first surface 1, a sidewall surface of the second through hole 221 may be inclined relative to the first surface 1. That is to say, the sidewall surface of the second through hole 221 is a smooth transition surface, which is conducive to avoiding the stress concentration problem caused by a sharp corner and further preventing sub-fissures and cracking of the cover plate 200.

In other embodiments, in the sectional direction perpendicular to the first surface, a sidewall surface of the second through hole may also be a stepped surface. That is to say, the sidewall surface of the second through hole is a step transition surface, which is conducive to reducing the manufacturing difficulty of the cover plate.

In addition, as shown in FIG. 11, in the sectional direction perpendicular to the first surface 1, a sidewall surface of the first through hole 211 is perpendicular to the first surface 1.

It should be noted that the above three examples may also be combined arbitrarily to obtain the cover plate 200 having the mechanical strength of the reinforced region I in the peripheral region P greater than that of the reinforced region I in the central region C.

Figure 12:
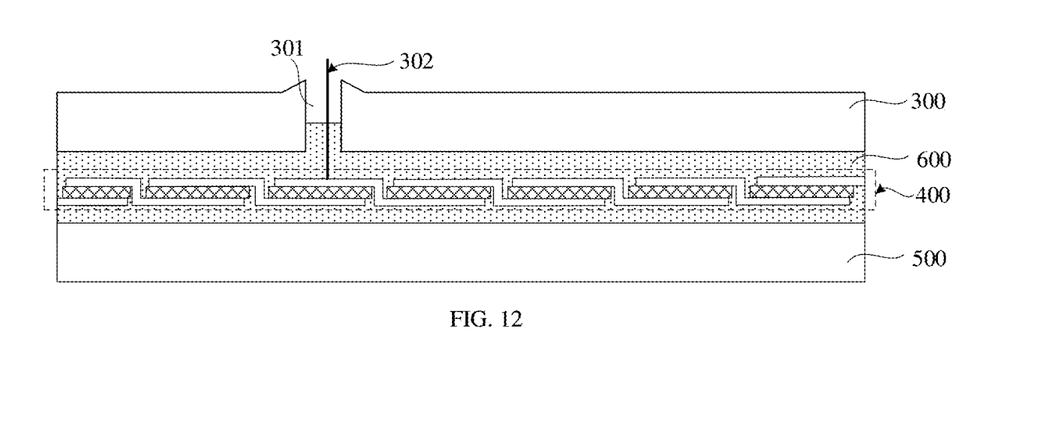
FIG. 12 is a schematic sectional diagram of a photovoltaic module according to an embodiment of the present disclosure.

For the cover plate 200 provided in the present embodiment, considering that the risk of sub-fissures in the peripheral region P is greater than that in the central region C, a cover plate 200 with a special structure is designed. The mechanical strength of the reinforced region I in the peripheral region P of the cover plate 200 is greater than that of the reinforced region I in the central region C. Correspondingly, an embodiment of the present disclosure further provides a photovoltaic module, including the cover plate in the above embodiments and at least one solar cell string. The photovoltaic module according to the present disclosure is described in detail below with the accompanying drawings. FIG. 12 is a schematic sectional diagram of a photovoltaic module according to another embodiment of the present disclosure.

Referring to FIG. 12, in an embodiment, the photovoltaic module includes: a cover plate 300 and at least one solar cell string 400. The cover plate 300 includes a reinforced region I and a flat region II, and the cover plate 300 further has a through hole 301 penetrating through the cover plate 300.

The solar cell string 400 includes a plurality of solar cells (unlabeled) and welding strips (unlabeled) electrically connected to adjacent solar cells.

The photovoltaic module may further include: at least one lead wire 302. The at least one lead wire 302 is electrically connected to at least one solar cell in the solar cell string 400 through the through hole 301. The solar cell string is electrically connected to a junction box through the lead wire 302.

In an embodiment, the cover plate 300 is a back panel of the photovoltaic module, that is, the cover plate 300 is located on a side of the solar cell string facing away from the sunlight, and the at least one lead wire 302 is electrically connected to at least one solar cell in the solar cell string through the through hole 301 of the cover plate 300. Correspondingly, the photovoltaic module further includes a front panel 500 that is located on a side of the solar cell string facing away from the cover plate.

It may be understood that in other embodiments, both the front panel and the back panel of the photovoltaic module may adopt the cover plate according to the above embodiments.

In addition, the photovoltaic module may further include: an anti-reflection film (not shown). The anti-reflection film is disposed on a surface of the cover plate 300, and a thickness of the anti-reflection film in the reinforced region I is greater than that in the flat region II. In particular, the anti-reflection film may be an anti-reflection coating. The anti-reflection film is disposed on a surface of the cover plate 300 facing away from the solar cell string. Since the thickness of the anti-reflection film in the reinforced region I is greater than that in the flat region II, an adverse effect of a thicker cover plate 300 in the reinforced region I on the light utilization rate may be counteracted, so that the light utilization rate of the photovoltaic module including the cover plate 300 with the special structural design may be higher.

The photovoltaic module may further include: a packaging adhesive 600. The packaging adhesive 600 is located between the solar cell string 400 and the cover plate 300, and may be further located between the solar cell string 400 and the front panel 500.

In the photovoltaic module according to the present disclosure, since the thickness of the cover plate 300 in the reinforced region I around the through hole 301 surrounding the cover plate 300 is greater than that of the cover plate 300 in the adjacent flat region II, the strength of the cover plate 300 in the reinforced region I around the through hole 301 is improved, which is conducive to avoiding the problem of sub-fissures or cracking of the cover plate 300 under stress, and thus improving the load resistance capability of the photovoltaic module, and improving the reliability of the photovoltaic module.

Those of ordinary skill in the art should understand that the above embodiments are specific embodiments for implementing the present disclosure, and in practical application, various changes may be made in form and details without departing from the spirit and scope of the present disclosure. The protection scope of the present disclosure should be subjected to the scope defined by the appended claims.

What is claimed is:

1. A cover plate for a photovoltaic module, comprising
at least one through hole penetrating through the cover plate,
a reinforced region surrounding the at least one through hole, and
a flat region adjacent to the reinforced region,
wherein a thickness of the cover plate in the reinforced region is greater than a thickness of the cover plate in the flat region,
wherein the cover plate comprises a central region and a peripheral region located on two opposite sides of the central region, respectively,
the at least one through hole comprises: a first through hole located in the central region and a second through hole located in the peripheral region, a mechanical strength of the reinforced region corresponding to the second through hole is greater than a mechanical strength of the reinforced region corresponding to the first through hole, and
wherein a maximum thickness of the cover plate in the reinforced region corresponding to the first through hole is a first thickness, a maximum thickness of the cover plate in the reinforced region corresponding to the second through hole is a second thickness, and the first thickness is less than the second thickness.

2. The cover plate according to claim 1, wherein the thickness of the cover plate in the reinforced region gradually decreases along a direction from the reinforced region toward the flat region.

3. The cover plate according to claim 2, wherein a surface of the cover plate in the reinforced region is a smooth transition inclined surface or a smooth transition curved surface.

4. The cover plate according to claim 1, wherein a surface of the cover plate in the reinforced region and a surface of the cover plate in the flat region are connected by a connecting line, and the connecting line is a boundary line between the surface of the cover plate in the reinforced region and the surface of the cover plate in the flat region.

5. The cover plate according to claim 2, wherein the cover plate has a front face and a back face opposite to the front face, wherein the front face in the reinforced region bulges away from the back face relative to the front face in the flat region, and the back face in the reinforced region bulges away from the front face relative to the back face in the flat region.

6. The cover plate according to claim 1, wherein a difference between a maximum thickness of the cover plate in the reinforced region and the thickness of the cover plate in the flat region is in a range from 0.1 mm to 0.5 mm.

7. The cover plate according to claim 1, wherein the cover plate is a glass cover plate, a polymer cover plate, or a stainless steel cover plate.

8. The cover plate according to claim 1, wherein in a sectional plane parallel to a surface of the cover plate in the flat region, a section of the through hole has a circular shape or an elliptic shape.

9. The cover plate according to claim 1, wherein a width R of the second through hole, a width w of the reinforced region, the thickness d of the cover plate in the flat region, and a difference L between the maximum thickness of the cover plate in the reinforced region corresponding to the second through hole and the thickness of the cover plate in the flat region satisfy following relation:

$$w \geq \frac{8 \times L \times \sqrt{R}}{d}.$$

10. The cover plate according to claim 1, wherein in a sectional direction parallel to a surface of the cover plate in the flat region, a sectional area of the first through hole is greater than a sectional area of the second through hole.

11. The cover plate according to claim 10, wherein the surface of the cover plate in the flat region is a first surface, the cover plate further comprises a second surface facing toward a solar cell string of the photovoltaic module and a third surface opposite to the second surface, and in a sectional direction perpendicular to the first surface, a second sectional area of the second through hole gradually increases in a direction from the second surface toward the third surface.

12. The cover plate according to claim 11, wherein in the sectional direction perpendicular to the first surface, a sidewall surface of the second through hole is inclined relative to the first surface.

13. The cover plate according to claim 11, wherein in the sectional direction perpendicular to the first surface, a sidewall surface of the second through hole is a stepped surface.

14. The cover plate according to claim 11, wherein in the sectional direction perpendicular to the first surface, a sidewall surface of the first through hole is perpendicular to the first surface.

15. A photovoltaic module, comprising a cover plate and at least one solar cell string, wherein the cover plate comprises:

at least one through hole penetrating through the cover plate, a reinforced region surrounding the at least one through hole, and a flat region adjacent to the reinforced region, wherein a thickness of the cover plate in the reinforced region is greater than a thickness of the cover plate in the flat region, wherein the cover plate comprises a central region and a peripheral region located on two opposite sides of the central region, respectively, the at least one through hole comprises: a first through hole located in the central region and a second through hole located in the peripheral region, a mechanical strength of the reinforced region corresponding to the second through hole is greater than a mechanical strength of the reinforced region corresponding to the first through hole, and wherein a maximum thickness of the cover plate in the reinforced region corresponding to the first through hole is a first thickness, a maximum thickness of the cover plate in the reinforced region corresponding to the second through hole is a second thickness, and the first thickness is less than the second thickness.

16. The photovoltaic module according to claim 15, further comprising at least one lead wire electrically connected, through the at least one through hole, to at least one solar cell in the at least one solar cell string.

17. The photovoltaic module according to claim 15, wherein the cover plate is a back panel of the photovoltaic module, and the photovoltaic module further comprises a front panel located on a side of the at least one solar cell string facing away from the cover plate.

18. The photovoltaic module according to claim 15, further comprising an anti-reflection film disposed on a surface of the cover plate, and a thickness of the anti-reflection film in the reinforced region is greater than a thickness of the anti-reflection film in the flat region.

* * * * *